United States Patent [19]

Steingroever

[11] 4,137,498

[45] Jan. 30, 1979

[54] MAGNETIC FLUX STANDARD AND METHOD FOR CALIBRATING FLUXMETERS

[76] Inventor: Erich A. Steingroever, Flensburger Strasse 33, 53 Bonn, Fed. Rep. of Germany

[21] Appl. No.: 811,715

[22] Filed: Jun. 30, 1977

[30] Foreign Application Priority Data

Nov. 15, 1976 [DE] Fed. Rep. of Germany ....... 2651999

[51] Int. Cl.² ............................................. G01R 35/00
[52] U.S. Cl. ..................................... 324/202; 361/148
[58] Field of Search ...................... 324/43, 47, 42, 202; 361/143, 147, 148

[56] References Cited

U.S. PATENT DOCUMENTS

| | | | |
|---|---|---|---|
| 2,624,783 | 1/1953 | Nedzel | 324/42 |
| 2,656,504 | 10/1953 | Elarde | 324/47 |

FOREIGN PATENT DOCUMENTS 1175238  3/1959  France .................................. 324/43 R

OTHER PUBLICATIONS

Steingroever, E.; Calibration of Permanent Magnet Measuring Instruments by Nickel; Jor. of Mag. & Mag. Mater; 2 (1976), pp. 267–269.

Primary Examiner—Robert J. Corcoran
Attorney, Agent, or Firm—George H. Mitchell, Jr.

[57] ABSTRACT

A magnetic flux standard and method for calibrating magnetic fluxmeters includes the use of a device for measuring changes in the flux of an air gap produced by the insertion into the gap of a magnetically saturable body of known dimensions and magnetic characteristics.

18 Claims, 5 Drawing Figures

MAGNETIC FLUX STANDARD AND METHOD FOR CALIBRATING FLUXMETERS

This invention relates to a magnetic flux standard which, by producing a predetermined change, or difference, in a magnetic flux path generates a signal which may be used for the calibration of instruments for measuring magnetic flux.

Magnetic flux standards are known wherein a coil is moved in the field of a permanent magnet as a result of which movement a predetermined change of flux may be produced. However, a standard of that type must first be calibrated by a fluxmeter which is known to be accurate.

It is therefore an object of the present invention to provide a magnetic flux standard which does not require any special calibration but by means of which the change of flux produced by a sample body may be calculated from the dimensions and magnetic characteristics of that sample body.

It has also been known to calibrate magnetic flux measuring instruments in the course of measurement of the hystereis curves of magnetic materials by the use of a sample body of pure nickel as disclosed in a paper by E. Steingroever in the Journal of Magnetism and Magnetic Materials 2 (1976), pp. 267-269. In that case a measuring device is disposed between the poles of an electromagnet and a change of flux is produced in it by varying the magnetic field between the poles. The known saturation magnetization Js of nickel (Js = 0.621 Tesla), will enable the calculation, when the crosssection of the sample body is known, of the change of flux produced by a change in the magnetic field. However, the cost of the apparatus for producing variations in the magnetic field between the poles of the electromagnet is considerable, and the manipulation of the apparatus is cumbersome.

The present invention avoids these disadvantages by the development of a magnetic flux standard in which the saturation magnetization of a sample body of magnetic material is used to produce a predetermined change in magnetic flux, and is characterized by a measuring coil, fixedly disposed in a magnetic air gap having a constant field strength into which air gap a magnetically saturable sample body is introduced.

Figure 1:
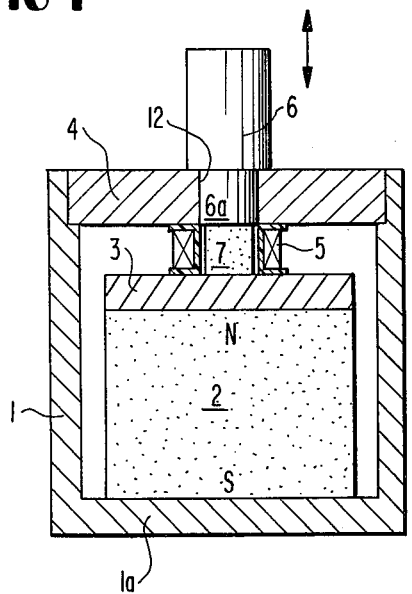
FIG. 1 is a cross-sectional elevation of a preferred form of magnetic flux standard constructed in accordance with this invention.

In FIG. 1 there is shown a metal pot, indicated by numeral 1, which is made of a ferromagnetic material, such as soft iron in which there is positioned a permanent magnet 2 preferably made of a highly coercive magnetic material such as ALNICO or samarium cobalt. One pole S of the permanent magnet is mounted in contact with the base 1a of the pot with the other pole N facing the open end of the pot and covered with an equalizing plate 3 of ferromagnetic material, preferably soft iron. Since the magnet 2 is oriented in the axial direction of the pot and the open end of the pot is closed by a plate 4 of soft iron, an air gap is formed between the two plates 3 and 4 within which air gap is substantially uniform and constant magnetic field exists.

The pole plate 4 is provided with a bore 12 and between the pole plates 3 and 4 there is positioned a measuring coil 5 concentrically disposed with respect to the air gap. A plug 6, preferably made of the same material as that of the plate 4 is provided with a reduced end portion 6a to conform to the size of the bore 12 serves as a support for the sample body 7 secured to the forward end of the reduced section 6a which is attached to by means of soldering or a suitable adhesive. The sample body 7 comprises a suitable material whose dimensions and saturation magnetization Js is known and when positioned by the plug bridges the air gap.

Thus, when the plug 6 carrying the sample body 7 is inserted or removed in the air gap a change in the flux develops in the measuring coil 5 which is approximately determined by the saturation magnetization and the cross-section of the body 7 because this body will be magnetically saturated due to its presence in the magnetic field established between pole pieces 3 and 4. In order to provide a more accurate result a second plug 8, having a reduced section 8a similar to that of the portion 6a of the first plug, and made of similar material can be substituted in the bore 12 when the first plug with the body 7 is removed. In this case there is still a deviation from the change in flux to be expected from a calculation of the saturation magnetization and the cross-section of the sample body 7 because of the fact that in each case the magnet 2 must supply a different amount of flux and therefore operates at different points on its demagnetization curve, with a corresponding result that there is a change in the field strength between the pole plates 3 and 4 when the substitution of plug 8 for the plug 6 is made.

Figure 4:
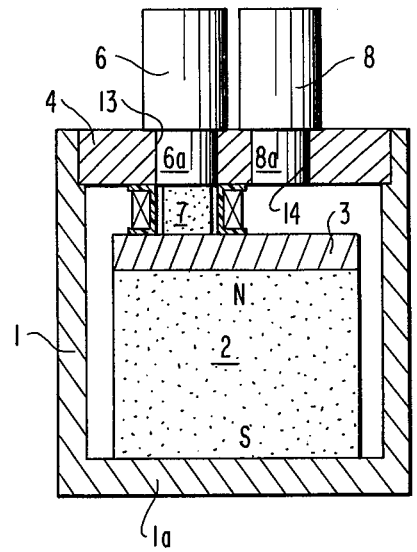
FIG. 4 is a cross-sectional elevation of a modified form of the invention.
Figure 2:
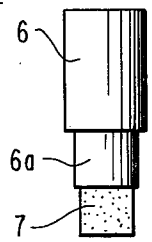
FIG. 2 is a view in elevation of a plug for holding a sample body.
Figure 3:
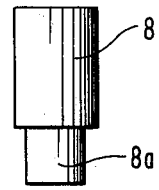
FIG. 3 is a view in elevation of a plug without the sample body.

These inaccuracies, however, can be avoided by the provision of two similar bores 13 and 14 in the plate 4, as shown in FIG. 4 with the measuring coil 5 positioned concentrically with respect to one of the bores 13. In this case when the plug 6, including the body 7, is exchanged with the bore 8 the change in the flux measured by the coil 5 is now exactly equal to the product of the saturation magnetization and the cross-section of the sample body 7 because the operating point of magnet 2 is the same before and after the exchange of the two plugs is made.

Figure 5:
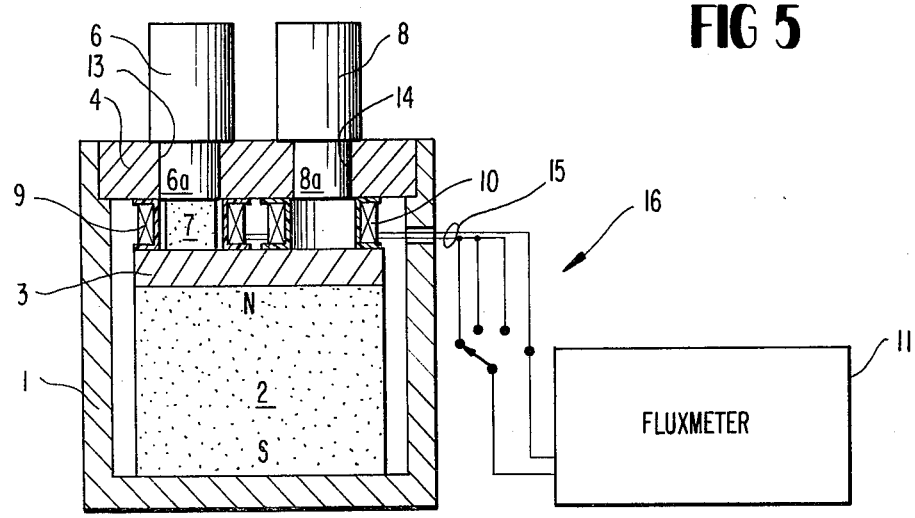
FIG. 5 is a cross-sectional elevation of a further modification of the invention.

A further modification of the flux measuring standard is shown in FIG. 5, in which two similar measuring coils 9 and 10 are positioned between the plates 3 and 4 concentrically with respect to their respective bores 13 and 14. In this case the coils 9 and 10 are connected in series so that when the plugs 6 and 8 are exchanged in the bores 13 and 14 the change in the flux measured is double that measured in the case of a single coil. The coils can be connected, by means of the wires 15 which extend outwardly through the wall of the pot 1, with a fluxmeter 11 which is to be calibrated. The coils may have their windings tapped so that, by the use of a switch 16 the electrical value of the output from the coils can be varied to suit the range of the particular fluxmeter being calibrated.

One of the most suitable materials from which the sample body 7 may be fabricated is pure nickel, for example, as described in German industry specification DIN 1701. Because the saturation magnetization of this material 0.621 Tesla, and a field strength of between 1,000 and 4,000 A/cm is required in the air gap, the induction produced in the pole plates 3 and 4 does not result in any noticeable saturation of these plates which would disturb the uniformity of the field in the air gap. However, other materials, for example ferromagnetic alloys with a corresponding value of saturation magnetization Js would be suitable for the fabrication of the sample body 7.

What is claimed is:

1. Apparatus for the calibration of flux measuring instruments comprising:
   a. means for establishing a magnetic circuit including an air gap, said circuit having a predetermined constant field strength across said air gap;
   b. a saturable calibrating element to be magnetically saturated by said field;
   c. means for inserting said calibrating element into said air gap in a reproducible position, and;
   d. sensing means disposed in said air gap, and being responsive to changes in flux resulting from insertion of the calibrating element into said air gap to generate corresponding changes in electrical values at its output;

whereby the change in value of the electrical output resulting from insertion of said calibrating element into the air gap provides a standard value for calibrating an instrument.

2. The apparatus defined in claim 1 wherein said magnetically saturable element comprises pure nickel.

3. The apparatus defined in claim 1 wherein said magnetic circuit comprises a pot of soft iron, and a permanent magnet contained within said pot, one pole of the magnet being in contact with the bottom wall of the pot, said air gap being defined by the other pole of said magnet and a soft iron plate closing the open end of the pot.

4. The apparatus defined in claim 3 wherein said plate is provided with a bore extending therethrough, said sensing means comprising a measuring coil being disposed generally concentric with said bore and between said plate and the other pole of the magnet, and a plug of soft iron removably received in said bore for supporting said magnetically saturable element in the air gap.

5. The apparatus defined in claim 4 wherein said measuring coil comprises a tapped winding to vary the output values.

6. The apparatus defined in claim 4 wherein said apparatus also includes a second soft iron plug removably received in said bore to provide a continuation of said plate for defining the air gap in the absence of said plug supporting said magnetically saturable element.

7. The apparatus defined in claim 4 wherein said plate is provided with a second bore similar to the first bore and spaced from the first bore, said apparatus including a second plug of soft iron similar in construction to the first plug to be removably received in said second bore to provide a continuation of said plate in the absence of the first plug.

8. The apparatus defined in claim 7 wherein said bores and plugs have similar dimensions to permit the plugs to be interchangeably received whereby the change in the output value of said measuring coil due to the presence or absence of the magnetically saturable element in the air gap will take place at the same operating point on the demagnetization curve of the permanent magnet.

9. The apparatus defined in claim 7 wherein said magnetically saturable element comprises pure nickel.

10. The apparatus defined in claim 7 whereby said bores and plugs have similar dimensions to permit the plugs to be interchangeably received whereby the change in the output value of said measuring coil due to the presence or absence of the magnetically saturable element in the air gap is determined solely by the crosssection and saturation magnetization of said element.

11. The apparatus defined in claim 7 wherein a second measuring coil is disposed generally concentric with said second bore and between said plate and the other pole of the magnet, said coils being connected electrically in series.

12. The apparatus defined in claim 11 wherein said measuring coils are provided with tapped windings to vary the output values.

13. The apparatus defined in claim 11 wherein said magnetically saturable element comprises pure nickel.

14. Method for calibrating flux measuring instruments comprising the steps of:
   establishing a magnetic circuit including an air gap having a predetermined constant field strength; inserting a magnetically saturable calibrating element into said air gap in a predetermined position, which element is magnetically saturated by said field and;
   sensing the change in flux at a fixed position in said air gap as a change in electrical values generated by said change in flux resulting from said insertion of the calibrating element, whereby said change in electrical value provides a standard value for calibrating an instrument.

15. Method of claim 14 wherein said magnetic circuit includes a magnet, said air gap is defined by two spaced components of ferromagnetic material and said calibrating element is mounted on a removable portion of one of said components, and said method includes the step of replacing said portion of said component with a similar portion of said ferromagnetic material when said calibrating element is removed, whereby said permanent magnet is operated approximately at the same point on its demagnetization curve after removal and insertion of said element.

16. Method of claim 14 which includes the additional steps of: sensing the change in flux at a second fixed position in said air gap parallel to the first-mentioned fixed position; removing said calibrating element from the first position in the air gap and inserting it into the second position in the air gap, and; measuring the change in flux sensed by said interchange.

17. Method of claim 16 wherein said air gap is defined by two spaced components of ferromagnetic material with one of the components defining the air gap includes two removable portions of ferromagnetic material, the calibrating element being mounted on one of said removable portions for insertion and removal of said calibrating element into the air gap at either one of said two positions.

18. Method of claim 16 which includes the additional step of measuring the change in flux additively at said two fixed positions.

* * * * *